US010003260B2

(12) United States Patent
Rowald et al.

(10) Patent No.: US 10,003,260 B2
(45) Date of Patent: Jun. 19, 2018

(54) SEMICONDUCTOR DEVICES AND METHODS FOR DEAD TIME OPTIMIZATION BY MEASURING GATE DRIVER RESPONSE TIME

(71) Applicant: FREESCALE SEMICONDUCTOR INC., Austin, TX (US)

(72) Inventors: Dirk Rowald, Munich (DE); Hubert M. Bode, Haar (DE)

(73) Assignee: NXP USA, Inc., Austin, TX (US)

(*) Notice: Subject to any disclaimer, the term of this patent is extended or adjusted under 35 U.S.C. 154(b) by 46 days.

(21) Appl. No.: 14/747,981

(22) Filed: Jun. 23, 2015

(65) Prior Publication Data
US 2016/0380536 A1 Dec. 29, 2016

(51) Int. Cl.
G06F 9/22 (2006.01)
H02M 3/158 (2006.01)
H02M 3/156 (2006.01)
H02M 1/38 (2007.01)
H03K 17/16 (2006.01)
H03K 17/284 (2006.01)
H02M 1/08 (2006.01)

(52) U.S. Cl.
CPC ............ H02M 3/158 (2013.01); H02M 1/38 (2013.01); H02M 3/156 (2013.01); H03K 17/162 (2013.01); H03K 17/284 (2013.01); H02M 1/08 (2013.01); H02M 2001/385 (2013.01)

(58) Field of Classification Search
None
See application file for complete search history.

(56) References Cited

U.S. PATENT DOCUMENTS 5,151,602 A * 9/1992 Idaka ................... H01L 31/173
136/293
5,481,178 A 1/1996 Wilcox et al.
5,731,694 A 3/1998 Wilcox et al.
5,764,024 A 6/1998 Wilson
6,249,111 B1 6/2001 Nguyen
6,294,954 B1 9/2001 Melanson
7,034,609 B2 4/2006 Risbo et al.
7,327,127 B2 2/2008 Ho
(Continued)

FOREIGN PATENT DOCUMENTS

JP        2011188624 A  *  9/2011

OTHER PUBLICATIONS

Application Note 735 Layout Considerations for Non-Isolated DC-DC Converteres, Maxim Integrated Products and Dallas Semiconductor, Mar. 1, 2001 , http://www.maxim-ic.com/appnotes.cfm/appnote_number/735.
(Continued)

Primary Examiner — Kim Huynh
Assistant Examiner — Danny Chan

(57) ABSTRACT

Switching control devices and related operating methods are provided. An exemplary electronic device includes a semiconductor die, a driver arrangement on the semiconductor die to generate a switch control output signal based on an input switching command signal, and a timer arrangement on the semiconductor die and coupled to the driver arrangement to measure a time difference between a first change in the command signal and an exhibited response in the switch control signal, which can then be utilized to achieve a desired dead time.

14 Claims, 3 Drawing Sheets

(56) References Cited

U.S. PATENT DOCUMENTS

| | | | |
|---|---|---|---|
| 7,358,711 | B2 | 4/2008 | Sutardja et al. |
| 7,368,898 | B2 | 5/2008 | Sutardja et al. |
| 7,411,377 | B2 | 8/2008 | Sutardja et al. |
| 7,800,350 | B2 | 9/2010 | Pigott |
| 9,047,270 | B2 | 6/2015 | Wu |
| 2001/0036085 | A1 | 11/2001 | Narita |
| 2002/0039017 | A1 | 4/2002 | Massie et al. |
| 2002/0074976 | A1 | 6/2002 | Kunii et al. |
| 2005/0167599 | A1 | 8/2005 | Schlyer et al. |
| 2006/0290401 | A1 | 12/2006 | Yanagigawa et al. |
| 2008/0246518 | A1* | 10/2008 | Galvano ............ H02M 1/38 327/110 |
| 2009/0046487 | A1* | 2/2009 | Emira ............ H02M 3/158 363/78 |
| 2010/0201443 | A1* | 8/2010 | Kaya ............ H03F 3/217 330/251 |
| 2012/0319754 | A1 | 12/2012 | Lee et al. |
| 2013/0069734 | A1* | 3/2013 | Matoba ............ H03K 7/08 332/109 |
| 2014/0217942 | A1 | 8/2014 | Fukuta et al. |
| 2016/0006402 | A1* | 1/2016 | Kaya ............ H03F 1/32 330/251 |

OTHER PUBLICATIONS

Application Note 725 DC/DC Conversion without Inductors, Maxim Integrated Products and Dallas Semiconductor, Dec. 29, 2000, http://www.maxim-ic.com/appnotes.cfm/appnote_number/735.

Application Note 2031 "DC-DC Converter Tutorial", Maxim Integrated Products and Dallas Semiconductor, Oct. 19, 2000, http://www.maxim-ic.com/appnotes.cfm/appnote_number/2031.

TPS54110, "3-V to 6-V input, 1.5-A Output Synchronous-Buck PWM Switcher with Integrated FETs (Swift)", Dec. 2003, revised Oct. 2005, http://www.ti.com/lit/gpn/tps54110.

European Patent Office, European Search Report for Application No. 16173418.1-1809 / 3109990, dated Mar. 3, 2017.

* cited by examiner

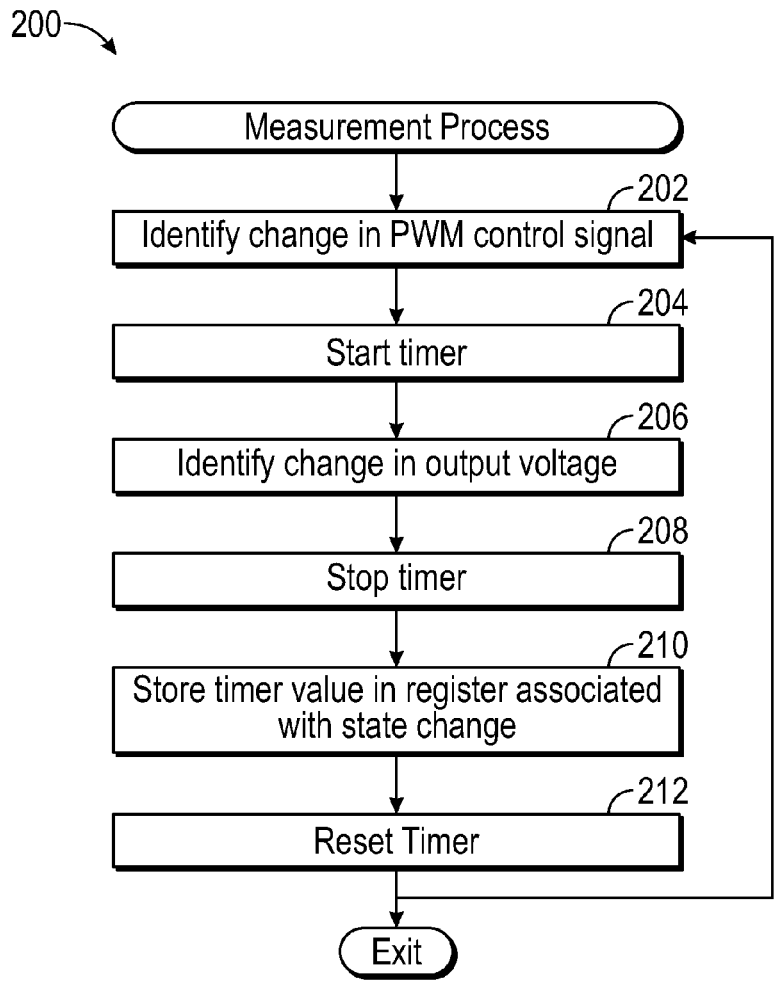
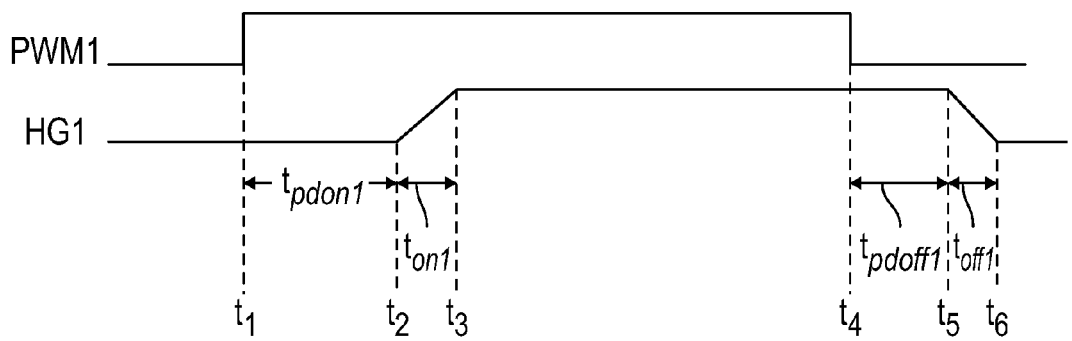
FIG. 3

SEMICONDUCTOR DEVICES AND METHODS FOR DEAD TIME OPTIMIZATION BY MEASURING GATE DRIVER RESPONSE TIME

TECHNICAL FIELD

Embodiments of the subject matter described herein relate generally to electronic devices, and more particularly, to switching control devices and related methods for dead time optimization.

BACKGROUND

Numerous devices or applications rely on power converters or other switching circuitry to support operation. For example, an electric motor can be controlled using a power inverter that converts a direct current (DC) voltage to an alternating current (AC) voltage with electronically controlled commutation. Often, switching devices require what is known as dead time to prevent a shoot-through current or otherwise short-circuiting the supply voltage in a manner that could result in potentially damaging currents through the switches. In practice, it is often desirable to minimize dead time to achieve reduced distortion or noise, improved efficiency, and the like. However, the effects of process, voltage and temperature (PVT) variations typically require the dead time to incorporate a margin to ensure shoot-through does not occur. In operation, the margin may overcompensate for the PVT variations, which, in turn, impairs the device performance. While some techniques have been employed to adapt the dead time, they typically involve shoot-through or overlap detection circuitry, which can be relatively expensive and, depending on the configuration, can degrade efficiency by consuming current during operation. Additionally, in some cases, shoot-through is initially required for dead time detection, which inherently risks damaging devices.

BRIEF DESCRIPTION OF THE DRAWINGS

The various embodiments will hereinafter be described in conjunction with the following drawing figures, which are not necessarily drawn to scale, wherein like numerals denote like elements, and wherein:

FIG. 2 depicts a flow diagram of an exemplary measurement process suitable for use with the switching control device of FIG. 1 in accordance with one embodiment of the invention;

FIG. 3 depicts a timing diagram illustrating the relationship between a switching command signal and a switching control signal in conjunction with the measurement process of FIG. 2 in accordance with one embodiment of the invention;

DETAILED DESCRIPTION

Embodiments of the subject matter described herein relate to switching control devices and related electronic device packages that are capable of measuring turn on and turn off delays associated with switching circuitry to achieve a desired (or targeted) dead time without adding excess margin and in a manner that is dynamically variable or adaptable to account for real-time variations in temperature, voltage, and the like. As described in greater detail below, in exemplary embodiments, a timer arrangement measures, for a respective switching element of the switching circuitry, turn on and turn off delays associated with the driver circuitry for the respective switching element. In this regard, the turn on delay represents the time difference between when an input switching command signal to the driver circuitry changes from a deasserted to an asserted state and when the output switching control signal generated by the driver circuitry exhibits a corresponding response (e.g., when the output switching control signal begins changing from a deasserted voltage level to an asserted voltage level) to turn on the switching element associated with the driver circuitry. Conversely, the turn off delay represents the time difference between when the input switching command signal transitions from an asserted to a deasserted state and when the output switching control signal exhibits a corresponding response (e.g., falls below a threshold voltage or begins changing from the asserted voltage level to the deasserted voltage level) to turn off the switching element.

Using the turn on and turn off delays associated with the respective instances of driver circuitry for the respective switching elements of the switching circuitry, a timing for subsequent state transitions in the respective input switching command signals can be determined that achieves a targeted dead time without adding excess margin or padding. In this manner, process, temperature, voltage, or other variations exhibited by the respective instances of the driver circuitry may be accounted for at run-time or during operation, and on a device-by-device basis, so that an accurate and reliable dead time can be achieved. Moreover, the turn on and turn off delays can be continually measured during each switching cycle to accommodate dynamic real-time adjustment of the input switching command signals relative to one another to consistently achieve the targeted dead time throughout operation, as described in greater detail below.

Figure 1:
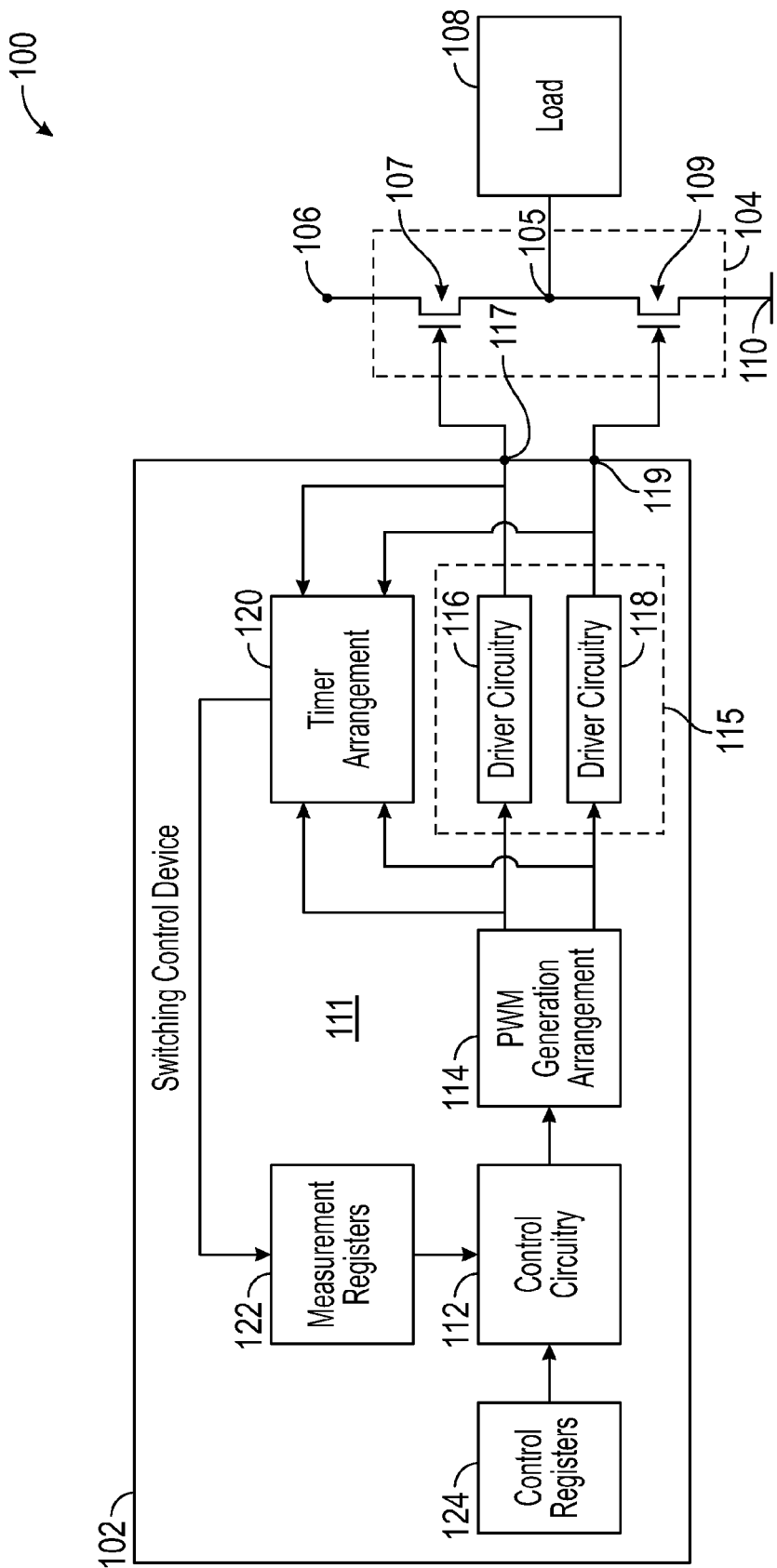
FIG. 1 depicts a block diagram of an exemplary electrical system including a switching control device for switching circuitry driving an electrical load in accordance with one embodiment of the invention.

FIG. 1 depicts an exemplary electrical system 100 including an electronic device package for a switching control device 102 in accordance with an embodiment of the present invention. In this regard, the switching control device 102 controls operation of switching circuitry 104 to regulate the current from/to a first node 106 to/from an electrical load 108, such as a motor. In the illustrated embodiment, the switching circuitry 104 is realized as a first switching element 107 (e.g., a transistor) coupled between the first node 106 and an output node 105 coupled to the electrical load 108 and a second switching element 109 coupled between the output node 105 and a second node 110. For purposes of explanation, the first node 106 may alternatively be referred to herein as a positive reference voltage node or a high side voltage node, the second node 110 may alternatively be referred to herein as a negative (or ground) reference voltage node or a low side voltage node, and accordingly, the first switching element 107 may alternatively be referred to herein as a high side switch and the second switching element 109 may alternatively be referred to herein as a low side switch.

It should be noted that FIG. 1 depicts merely one simplified representation of the electrical system 100, and in practice, the switching circuitry 104 may include additional switching elements configured to provide a desired number of output nodes 105 to support a desired electrical load 108, with the switching control device 102 being appropriately modified in a corresponding manner. For example, in practice, the illustrated switching circuitry 104 may be part of an H bridge arrangement of a power converter, a power inverter, or the like, which includes multiple instances of the switching circuitry 104 to support an electrical load 108 with multiple phases. In one embodiment, where the electrical load 108 is a brushless direct current (DC) electric motor, the output node 105 of the switching circuitry 104 is connected to a first phase of the stator windings of an electric motor 108, with the output nodes 105 of additional instances of the switching circuitry 104 being connected to the other phases of the stator windings. Additionally, it should be noted that although FIG. 1 depicts the switching elements 107, 109 as being realized as metal-oxide-semiconductor field-effect transistors (MOSFETs), the subject matter described herein is not limited to the type of transistors or switches being utilized, and other types of transistors may be utilized (e.g., insulated-gate bipolar transistors (IGBTs), or the like).

The illustrated switching control device 102 includes, without limitation, control circuitry 112, a pulse generation arrangement 114, a driver arrangement 115, a timer arrangement 120, and registers 122, 124 to store values for control parameters utilized by the control circuitry 112 when operating the switching circuitry 104, as described in greater detail below. In exemplary embodiments, the control circuitry 112, the pulse generation arrangement 114, the driver circuitry 116, 118, the timer arrangement 120, and the registers 122, 124 are all formed, fabricated, or otherwise provided on a common semiconductor die 111. That said, in various embodiments, one or more of the components described herein in the context of the switching control device 102 may be fabricated on a different or separate semiconductor die. Moreover, in some embodiments, the switching circuitry 104 may be integrated or otherwise fabricated on the switching control die 111 and integrated or otherwise packaged with the switching control device 102.

The control circuitry 112 generally represents the hardware, circuitry, processing logic, or other combination of electrical hardware components of the switching control device 102 that are configured to support operation of the switching control device 102 and the various tasks, operations, functions, or processes described herein. In some embodiments, one or more switching control applications that support operation of the switching circuitry 104 within the electrical system 100 can be generated or otherwise implemented using programming instructions stored on a non-transitory data storage element (or memory) that are read and executed by the control circuitry 112. In exemplary embodiments, a switching control application implemented by the control circuitry 112 accesses the registers 122, 124 to generate or otherwise pulse timing command signals for the respective switching elements 107, 109 which are provided to the pulse generation arrangement 114.

The pulse generation arrangement 114 generally represents the hardware, circuitry, logic, or other combination of electrical hardware components of the switching control device 102 configured to pulses corresponding to the pulse timing command signals provided by the control circuitry 112. In exemplary embodiments, the pulse generation arrangement 114 generates pulse-width modulation (PWM) switching command signals having a duration (or width or duty cycle) and timing corresponding to the respective pulse timing command signals provided by the control circuitry 112, and accordingly, the pulse generation arrangement 114 may alternatively be referred to herein as the PWM generation arrangement 114. The driver arrangement 115 includes instances of driver circuitry 116, 118 associated with (and configured to control operation of) the respective switches 107, 109 of the switching circuitry 104. The driver circuitry 116, 118 generally represents the hardware, circuitry, logic, or other combination of electrical hardware components coupled to the respective outputs of the PWM generation arrangement 114 that are configured to convert or otherwise translate the PWM switching command signals output by the PWM generation arrangement 114 into corresponding switching control voltage signals provided to the control (or gate) terminals of the switching elements 107, 109 at the respective output interfaces 117, 119 of the switching control device 102. For example, high side driver circuitry 116 translates or otherwise converts a PWM command signal corresponding to the high side switch 107 (PWM1) into a corresponding gate voltage control signal (HG1) to be applied to the gate of the high side switch 107 at the high side output interface 117. In this regard, the high side driver circuitry 116 may include level shifters, buffers, amplifiers, drivers, and the like configured to produce an output voltage capable of activating or otherwise turning on the high side switch 107 based on the input PWM signal. Similarly, the low side driver circuitry 118 translates or otherwise converts a PWM signal corresponding to the low side switch 109 (PWM2) into a corresponding gate voltage (LG1) to be applied to the gate of the low side switch 109 at the low side output interface 119.

Still referring to FIG. 1, the timer arrangement 120 generally represents the hardware, circuitry, logic, or other combination of electrical hardware components configured to measure or otherwise obtain the time difference between a change in the state of a PWM switching command signal output by the PWM generation arrangement 114 (or input to the driver arrangement 115) and a corresponding change in the state of the switching control voltage signal provided to the control (or gate) terminal of a respective switching element 107, 109 at the respective output interface 117, 119 of the switching control device 102. In this regard, the timer arrangement 120 includes at least one timer or similar feature capable of measuring or otherwise determining the time difference (or number of clock cycles) between signal state changes. For example, the timer arrangement 120 may include a timer associated with each respective instance of driver circuitry 116, 118 of the driver arrangement 115 (or alternatively, each respective switching element 107, 109 of the switching circuitry 104) to measure, for each respective switching element 107, 109, the delay between the assertion or deassertion of its respective PWM command signal and the corresponding change in the voltage control signal applied to its control terminal As described in greater detail below in the context of FIGS. 2-3, in practice, there is a nonzero time difference between when a change in a PWM command signal produces a corresponding change in the output gate control voltage due to the impedances or propagation delays associated with the driver circuitry 116, 118 (which, in turn, may be influenced by PVT variations) in conjunction with the gate capacitance of the switching element 107, 109 at the output terminal 117, 119 (which may also vary across devices or operating conditions).

The timer arrangement 120 is coupled to the measurement registers 122, which store or otherwise maintain measurement values for the time differences between changes in a PWM command signal and corresponding changes in the output voltage provided to each of the switching elements 107, 109. The measurement values are utilized by the switching control application of the control circuitry 112 to achieve a desired dead time, as described in greater detail below in the context of FIGS. 4-5. Accordingly, the measurement registers 122 may alternatively be referred to herein as dead time measurement registers, or simply, dead time registers. The control registers 124 may store or otherwise maintain a value representing a desired dead time ($d_t$) for the switching circuitry 104 that is utilized by the switching control application of the control circuitry 112 to determine corresponding dead time offsets ($t_{dp}$) for the PWM command signals for the respective switching elements 107, 109 to avoid short-circuiting reference nodes 106, 110 (or shoot-through) via the switching elements 107, 109. Additionally, in some embodiments, the control registers 124 may also store or otherwise maintain values representing characteristics of the switching elements 107, 109 (e.g., rise times, fall times, settling times, or the like) that may be utilized by the switching control application when determining dead time offsets. Alternatively, the switching control application of the control circuitry 112 may utilize a lookup table or the like to identify or otherwise determine the appropriate characteristic values for the current operating conditions (e.g., the current temperature). In practice, the target dead time ($d_t$) as well as one or more of the switch characteristic values may be user configurable or otherwise variable, while in other embodiments, the target dead time ($d_t$) or the switch characteristic values may be fixed throughout operation of the electrical system 100.

In the illustrated embodiment of FIG. 1, the timer arrangement 120 is coupled to the output of the PWM generation arrangement 114 corresponding to the high side PWM command signal (PWM1), and the timer arrangement 120 is also coupled to the output of the high side driver circuitry 116 (or alternatively, the high side output interface 117) to measure the time difference between a change in the state of the high side PWM command signal (PWM1) and a corresponding change in state of the high side gate voltage (HG1). As described in greater detail below in the context of FIGS. 2-3, the timer arrangement 120 stores or otherwise maintains, in a first dead time register 122, a measurement value for the time difference ($t_{pdon1}$) between assertion of the high side PWM command signal (PWM1) and a corresponding change in the high side gate voltage (HG1), and similarly stores or otherwise maintains, in a second dead time register 122, a measurement value for the time difference associated with deassertion of the high side PWM command signal (PWM1) and a corresponding change in the high side gate voltage (HG1). Depending on the embodiment, the time difference associated with deassertion of the high side PWM command signal (PWM1) may be a measurement value for the time difference between deassertion of the high side PWM command signal (PWM1) and an initial change in the high side gate voltage (HG1) ($t_{pdoff1}$), or alternatively, the time difference associated with deassertion of the high side PWM command signal (PWM1) may be a measurement value for the time difference between deassertion of the high side PWM command signal (PWM1) and a time when the high side gate voltage (HG1) settles at or below a threshold voltage ($t_{pdoff1}+t_{off1}$). The timer arrangement 120 is also coupled to the output of the PWM generation arrangement 114 corresponding to the low side PWM command signal (PWM2) and the output of the low side driver circuitry 118 to measure the time difference ($t_{pdon2}$) between assertion of the low side PWM command signal (PWM2) and a corresponding change in the low side gate voltage (LG1) and the time difference ($t_{pdoff2}+t_{off2}$, or alternatively, $t_{pdoff2}$) between deassertion of the low side PWM command signal (PWM2) and a corresponding change in the low side gate voltage (LG1).

FIG. 2 depicts an exemplary measurement process 200 suitable for implementation by a switching control device to measure or otherwise obtain measurements of the delays associated with asserting or deasserting a switching control signal for purposes of achieving a targeted dead time. For illustrative purposes, the following description may refer to elements described above in connection with FIG. 1. In practice, portions of the measurement process 200 may be performed by different elements of the switching control device 102, such as, for example, the control circuitry 112, the PWM generation arrangement 114, the driver circuitry 116, 118, the timer arrangement 120, or the registers 122, 124. It should be appreciated that practical embodiments of the measurement process 200 may include any number of additional or alternative tasks, the tasks need not be performed in the illustrated order, the tasks may be performed concurrently, or the measurement process 200 may be incorporated into a more comprehensive procedure or process having additional functionality not described in detail herein. Moreover, one or more of the tasks shown and described in the context of FIG. 2 could be omitted from a practical embodiment of the measurement process 200 as long as the intended overall functionality remains intact.

In exemplary embodiments, the measurement process 200 begins by detecting or otherwise identifying a change in the state of a switching command signal, and in response, starting or otherwise initiating a timer (tasks 202, 204). For example, referring to FIGS. 1 and 3, the timer arrangement 120 may detect or otherwise identify assertion of the high side PWM command signal (PWM1) at an initial time $t_1$, and in response, start or otherwise initiate a timer associated with the high side switching signals. Thereafter, the value of the timer automatically accrues to measure the delay between assertion of the high side PWM command signal (PWM1) and a corresponding change in the voltage applied to the high side switch 107 at the high side output terminal 117.

Referring again to FIG. 2 and with continued reference to FIGS. 1 and 3, the measurement process 200 continues by detecting or otherwise identifying a change in the output control signal corresponding to the change in the command signal, and in response, stopping or otherwise pausing the timer (tasks 206, 208). Thereafter, the measurement process 200 stores or otherwise maintains the value of the timer as the delay value associated with the respective change in the control signal before resetting or otherwise clearing the timer value (tasks 210, 212). In this regard, at some subsequent time $t_2$, the timer arrangement 120 may detect or otherwise identify when the high side gate voltage (HG1) begins increasing from its initial deasserted voltage at time $t_1$. In response, the timer associated with the high side switching signal is stopped and its current value (e.g., $t_2-t_1=t_{pdon1}$) is stored or otherwise maintained in the dead time register 122 associated with assertion of the high side PWM command signal (PWM1) as the measurement value for the turn on delay ($t_{pdon1}$) between assertion of the high side PWM command signal (PWM1) and a rise in the high side gate voltage (HG1), which corresponds to the high side switch 107 starting to turn on. As illustrated in FIG. 3, the time difference between when the high side gate voltage (HG1) begins to change and when the high side gate voltage (HG1) settles at its asserted voltage at time $t_3$ corresponds to the rise time ($t_{on}$) of the gate capacitance associated with the switching element 107 at the high side terminal 117, which may be stored or otherwise maintained as a control parameter in the control registers 124 or determined by the switching control application on the control circuitry 112.

After the measurement value is stored, the timer associated with the high side switching signal may be reset, and the measurement process 200 may repeat for the deassertion of the high side PWM command signal (PWM1). At time $t_4$, the timer arrangement 120 may detect or otherwise identify deassertion of the high side PWM command signal (PWM1), and in response, start the timer associated with the high side switching signals. In exemplary embodiments, the timer value automatically accrues until the timer arrangement 120 detects or otherwise identifies that the high side gate voltage (HG1) has settled below a threshold value at time $t_6$, at which point the timer associated with the high side switching signal is stopped. Again, the current value of the timer (e.g., $t_6-t_4=t_{pdoff1}+t_{off1}$) is stored or otherwise maintained in the dead time register 122 associated with deassertion of the high side PWM command signal (PWM1) as the measurement value for the time difference between deassertion of the high side PWM command signal (PWM1) and a high side gate voltage (HG1) corresponding to the high side switch 107 being effectively turned off. In such embodiments, variations in the fall time ($t_{off1}$) of the gate capacitance associated with the switching element 107 at the high side terminal 117 attributable to temperature, voltage, or process variations can be accounted for both dynamically, and on a device-by-device basis.

In alternative embodiments, the timer value accrues until the timer arrangement 120 detects or otherwise identifies that the high side gate voltage (HG1) begins decreasing from its asserted value at time $t_5$, and the current value of the timer (e.g., $t_5-t_4=t_{pdoff1}$) is stored or otherwise maintained in the dead time register 122 associated with deassertion of the high side PWM command signal (PWM1) as the measurement value for the time difference between deassertion of the high side PWM command signal (PWM1) and a drop in the high side gate voltage (HG1) corresponding to the start of the high side switch 107 turning off. In such embodiments, the time difference between when the high side gate voltage (HG1) begins to change at time $t_5$ and when the high side gate voltage (HG1) settles at its deasserted voltage at time $t_6$ corresponds to the fall time ($t_{off1}$) of the gate capacitance associated with the switching element 107 at the high side terminal 117, and the fall time ($t_{off1}$) of the gate capacitance associated with the switching element 107 can be stored or otherwise maintained as a control parameter in the control registers 124 or otherwise determined by the control circuitry 112.

It should be noted that in some embodiments the measurement process 200 may continually repeat throughout operation of the electrical system 100 to dynamically update the propagation delays associated with the high side switch 107. In this regard, as operating conditions change (e.g., temperature, voltage, or the like), the measured time differences between when the high side PWM command signal (PWM1) changes and when the high side switch 107 starts to turn on or off may be dynamically updated to reflect the current operating conditions. That said, in some embodiments, the measurement process 200 may be performed only once (e.g., upon power on or initiation of the switching control device 102) or periodically throughout operation.

In exemplary embodiments, the measurement process 200 is performed for the control signals for each of the switching elements 107, 109 of the switching circuitry 104. Thus, in a similar manner as described above, the timer arrangement 120 may detect or otherwise identify assertion of the low side PWM command signal (PWM2), and in response, start or otherwise initiate a timer associated with the low side switching signals. Thereafter, in response to detecting or otherwise identifying a change in the low side gate voltage (LG1) from its deasserted voltage, the timer associated with the low side switching signal is stopped and its current value is stored or otherwise maintained in the dead time register 122 associated with assertion (or deassertion) of the low side PWM command signal (PWM2) as the measurement value for the time difference ($t_{pdon2}$) between assertion of the low side PWM command signal (PWM2) and a rise in the low side gate voltage (LG1), which corresponds to the low side switch 109 starting to turn on. The timer associated with the low side switching signal may then be reset, and a measurement value for the turn off time difference ($t_{pdoff2}+t_{off2}$ or $t_{pdoff2}$) between deassertion of the low side PWM command signal (PWM2) and a fall in the low side gate voltage (LG1) may be similarly obtained. Again, depending on the embodiment, the measurement process 200 may be repeated as desired to during operation of the electrical system 100 to dynamically update the measurements for the propagation delays associated with the low side switch 109. By performing the measurement process 200 for each instance of driver circuitry 116, 118, process, voltage, temperature, or other variations exhibited by one instance of driver circuitry 116, 118 relative to another instance of driver circuitry 116, 118 are also accounted for, and for each state transition. For example, the hardware or components of the driver circuitry 116, 118 may be designed or otherwise intended to be identical, but in practice, can exhibit different operating characteristics.

Figure 4:
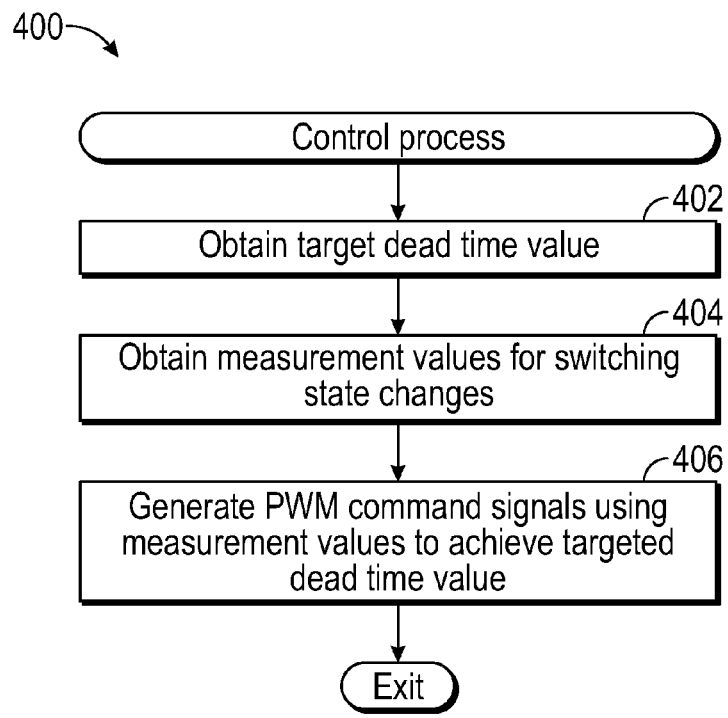
FIG. 4 depicts a flow diagram of an exemplary control process suitable for use with the switching control device of FIG. 1 in conjunction with the measurement process of FIG. 2 in accordance with one embodiment of the invention.

FIG. 4 depicts an exemplary embodiment of a control process 400 suitable for implementation by a switching control device in conjunction with the measurement process 200 to achieve a targeted dead time. For illustrative purposes, the following description may refer to elements described above in connection with FIG. 1. In practice, portions of the control process 400 may be performed by different elements of the switching control device 102, such as, for example, the control circuitry 112, the PWM generation arrangement 114, the driver circuitry 116, 118, the timer arrangement 120, or the registers 122, 124. It should be appreciated that practical embodiments of the control process 400 may include any number of additional or alternative tasks, the tasks need not be performed in the illustrated order, the tasks may be performed concurrently, or the control process 400 may be incorporated into a more comprehensive procedure or process having additional functionality not described in detail herein. Moreover, one or more of the tasks shown and described in the context of FIG. 4 could be omitted from a practical embodiment of the control process 400 as long as the intended overall functionality remains intact.

In exemplary embodiments, the control process 400 is performed for each PWM command cycle after determining the output voltages to be provided to the electrical load to achieve a desired operation. For example, based on feedback such as one or more measured current(s) through the phase(s) of the electric motor 108, a measured position of the rotor of the electric motor 108, and the like, the switching control application executed by the control circuitry 112 may calculate or otherwise determine the relative timing and duration for which the high and low side switches 107, 109 should be turned on or off to achieve the desired operation of the electric motor 108 over the next PWM cycle. Thereafter, the control process 400 utilizes the measurement values for the delays associated with the high side and low side output voltage signals to generate corresponding PWM command signals having state transitions that result in output voltages at the respective output interfaces 117, 119 achieving the desired timing and duty cycle for the high and low side switches 107, 109 while also achieving the targeted dead time for the switching circuitry 104.

After the timing and duration for operating the switches of the switching circuitry is determined, the control process 400 continues by obtaining the desired or targeted dead time, obtaining the measurement values for the delays associated with turning on and turning off the switches of the switching circuitry, and determining or otherwise generating PWM command signals using the delay measurement values to achieve the targeted dead time while also achieving the desired timing and duration of operation for the switches (tasks 402, 404, 406). In this regard, to achieve the targeted dead time $d_t$ obtained from the corresponding control register 124, the control circuitry 112 calculates or otherwise determines an offset between turning off the low side switch 109 and turning on the high side switch 107 ($t_{dp1}$), and similarly, determines an offset between turning off the high side switch 107 and turning on the low side switch 109 ($t_{dp2}$). In exemplary embodiments, the offset associated with turning on the high side switch 107 ($t_{dp1}$) may be governed by the equation $d_t = t_{dp1} + t_{pdon1} - (t_{pdoff2} + t_{off2})$, where $d_t$ is the targeted dead time value, $t_{pdon1}$ is the propagation delay associated with turning on the high side switch 107, $t_{pdoff2}$ is the propagation delay associated with turning off the low side switch 109, and $t_{off2}$ is the fall time characteristic value associated with the switch 109, which may be measured with the propagation delay or alternatively stored in a control register 124 or dynamically determined based on current operating conditions, as described above. Similarly, the offset associated with turning on the low side switch 109 ($t_{dp2}$) may be governed by the equation $d_t = t_{dp2} + t_{pdon2} - (t_{pdoff1} + t_{off1})$, where $d_t$ is the targeted dead time value, $t_{pdon2}$ is the propagation delay associated with turning on the low side switch 109, $t_{pdoff1}$ is the propagation delay associated with turning off the high side switch 107, and $t_{off1}$ is the fall time characteristic value associated with the switch 107.

After the PWM command signal offset values ($t_{dp1}$ and $t_{dp2}$) are determined, the control circuitry 112 determines the relative timings for the rise and fall of the PWM command signals (PWM1 and PWM2) that achieve the desired relative durations of operation for the respective switches 107, 109 at or during the desired time periods within the PWM cycle. The control circuitry 112 transmits or otherwise provides the relative timings for the rise and fall of the PWM command signals to the PWM generation arrangement 114, which, in turn, generates the PWM command signals provided to the driver circuitry 116, 118 that result in the switches 107, 109 of the switching circuitry 104 being turned on and off at the appropriate times with the targeted amount of dead time.

Figure 5:
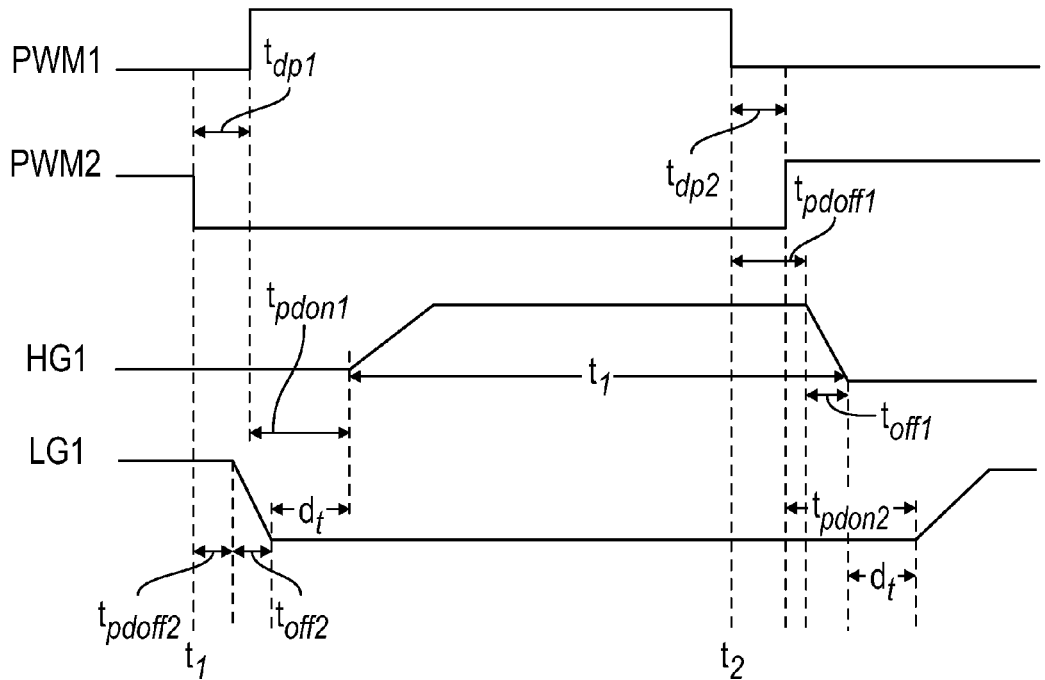
FIG. 5 depicts a timing diagram illustrating operation of the switching control device in accordance with the control process of FIG. 4 in accordance with one embodiment of the invention.

FIG. 5 depicts an exemplary PWM cycle illustrating operation of the switches 107, 109 of the switching circuitry 104 in conjunction with the control process 400 of FIG. 4 and the measurement process 200 of FIG. 2. As described above, the measurement process 200 may be performed with respect to each of the switches 107, 109 to identify the high side turn on delay ($t_{pdon1}$), the high side turn off delay (either a combined measurement of or $t_{pdoff1} + t_{off1}$ or a measurement of $t_{pdoff1}$ plus a stored or calculated characteristic value for $t_{off1}$), the low side turn on delay ($t_{pdon2}$), and the low side turn off delay (either a combined measurement of or $t_{pdoff2} + t_{off2}$ or a measurement of $t_{pdoff2}$ plus a stored or calculated characteristic value for $t_{off2}$). Based on the delay measurement values, the targeted dead time value, and the characteristic turn off value for the switches 107, 109, the switching control application on the control circuitry 112 determines the desired offset $t_{dp1}$ for the high side PWM command signal PWM1 and the desired offset $t_{dp2}$ for the low side PWM command signal PWM2. Using the offsets, the switching control application on the control circuitry 112 determines a first time ($t_1$) during the PWM cycle at which the low side PWM command signal PWM2 should initiate turn off of the low side switch 109 and a second time ($t_2$) during the PWM cycle at which the high side PWM command signal PWM1 should initiate turn off of the high side switch 107, and based thereon, determines a time at which the high side PWM command signal PWM1 should initiate turn on of the high side switch 107 ($t_1 + t_{dp1}$) and a time at which the low side PWM command signal PWM2 should initiate turn on of the high side switch 107 ($t_2 + t_{dp2}$). Alternatively, the switching control application on the control circuitry 112 may determine the times at which the PWM command signals should initiate turn on and then use the offsets to determine the times at which the PWM command signals should initiate turn off based thereon.

In exemplary embodiments, the switching control application on the control circuitry 112 determines the timing for initiating turn on and turn off such that the duration ($t_H$) of the high side switch 107 being turned on or otherwise conducting at least a portion of the current to/from the electrical load 108 relative to the duration of the low side switch 109 being turned on or otherwise conducting during the PWM cycle corresponds to the desired PWM duty cycle. For example, if the desired high side duty cycle is 60% and the desired low side duty cycle is 40%, the duration ($t_H$) of the high side switch 107 conductivity should be 50% more than the duration of the low side switch 109 conductivity. Additionally, one or more of the times at which the PWM command signals should initiate turn on or turn off may be chosen to achieve the desired timing within the PWM cycle relative to other instances of the switching circuitry 104.

As illustrated in FIG. 5, the PWM command signal offset values ($t_{dp1}$ and $t_{dp2}$) account for variations between the turn off delays and the corresponding turn on delays (e.g., differences between $t_{pdon1}$, $t_{pdoff2}$, and $t_{off2}$ or differences between $t_{pdon2}$, $t_{pdoff1}$, and $t_{off2}$) to ensure a desired dead time that avoids potentially damaging shoot-through currents. By virtue of the turn on and turn off delays being measured during or before operation, the turn on and turn off delays account for PVT variations or real-time operating conditions experienced by the die 111, and thereby allow for the targeted dead time ($d_t$) to be achieved without being padded or otherwise incurring excess margin. Furthermore, as described above, the measurement process 200 may be repeatedly performed during each PWM cycle to facilitate dynamically updating the turn on and turn off delays, which, in turn, are then incorporated in the subsequent iteration of the control process 400, thereby allowing for the PWM command signals to be generated in an optimal manner without unnecessary offsets or dead time in excess of what is required or desired. Moreover, external circuitry such as overlap detectors, shoot-through detectors, and the like are not required, thereby reducing costs and complexity relative to some other approaches. Additionally, since the targeted dead time ($d_t$) can be precisely achieved and optimized as desired, the effective duty cycle can also be more precisely achieved or optimized, thereby leading to better control of the output voltage or current provided via the switching element, and thereby less noise, less torque ripple, improved control or efficiency, and the like.

For the sake of brevity, conventional techniques related to semiconductor or integrated circuit fabrication, device packaging, pulse-width modulation and related motor controls, and other functional aspects of the subject matter may not be described in detail herein. In addition, certain terminology may be used herein for the purpose of reference only, and thus are not intended to be limiting. For example, the terms "first," "second," and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements or terminals, alternative embodiments may employ intervening circuit elements or components while functioning in a substantially similar manner In conclusion, systems, devices, and methods configured in accordance with example embodiments of the invention relate to:

An apparatus for an electronic device is provided. The electronic device comprises a semiconductor die, a driver arrangement on the semiconductor die to generate a switch control signal based on a command signal, and a timer arrangement on the semiconductor die and coupled to the driver arrangement to measure a time difference between a first change in the command signal and a second response to the first change in the switch control signal. In one embodiment, the electronic device further comprises a register coupled to the timer arrangement to store the time difference. In a further embodiment, the electronic device comprises control circuitry coupled to the register to determine a timing for a subsequent change in the command signal based at least in part on the time difference. In some embodiments, the electronic device further comprises a second register to store a target dead time value, wherein the control circuitry is coupled to the second register to determine the timing based at least in part on the time difference and the target dead time value. In another embodiment, the electronic device further comprises a pulse generation arrangement coupled between the driver arrangement and the control circuitry to generate the command signal based on the timing.

In one embodiment, the timer arrangement automatically accrues a timer value in response to the first change in the command signal and automatically stops accrual of the timer value in response to the second response in the switch control signal. In a further embodiment, the electronic device comprises a register coupled to the timer arrangement to store the timer value after the second response in the switch control signal.

In another embodiment, the electronic device comprises control circuitry fabricated on the semiconductor die, wherein the control circuitry is coupled to the timer arrangement to determine a timing for a subsequent change in the command signal based at least in part on the time difference. In one embodiment, the electronic device further comprises a pulse generation arrangement fabricated on the semiconductor die, wherein the pulse generation arrangement is coupled between the driver arrangement and the control circuitry to generate the command signal based on the timing.

In another embodiment, the driver arrangement comprises first driver circuitry to generate the switch control signal based on the command signal and second driver circuitry to generate a second switch control signal based on a second command signal, and the timer arrangement is coupled to the driver arrangement to measure a second time difference between a third change in the second command signal and a fourth change in the second switch control signal. In one embodiment, the time difference comprises a turn on delay associated with a first switching element coupled to the first driver circuitry and the second time difference comprises a turn off delay associated with a second switching element coupled to the second driver circuitry. In another embodiment, the electronic device further comprises control circuitry to determine a timing for a subsequent change in the command signal based at least in part on a difference between turn on delay and the turn off delay. In one embodiment, the control circuitry determines an offset for the subsequent change in the command signal relative to a fifth change in the second command signal based at least in part on a target dead time and the difference between turn on delay and the turn off delay.

In another embodiment, a method of operating switching circuitry comprising a first switching element and a second switching element is provided. The method comprises measuring, by a timer arrangement on a semiconductor die, a turn on delay associated with first driver circuitry on the semiconductor die that is coupled to the first switching element, measuring, by the timer arrangement, a turn off delay associated with second driver circuitry on the semiconductor die that is coupled to the second switching element, and determining an offset for a command signal provided to the first driver circuitry for operating the first switching element based on a difference between the turn on delay and the turn off delay. In one embodiment, the first driver circuitry generates a first output signal in response to a first command signal and the second driver circuitry generates a second output signal in response to a second command signal, wherein measuring the turn on delay comprises the timer arrangement measuring a first time difference between a first change in the first command signal and a second change in the first output signal, and measuring the turn off delay comprises the timer arrangement measuring a second time difference between a third change in the second command signal and a fourth change in the second output signal. In a further embodiment, determining the offset comprises determining the offset for a subsequent change in the first command signal relative to a second subsequent change in the second command signal based on a targeted dead time and the difference between the first time difference and the second time difference. In another embodiment, determining the offset comprises determining the offset for assertion of the command signal relative to deassertion of a second command signal provided to the second driver circuitry based on a targeted dead time and the difference between the turn on delay and the turn off delay. In one embodiment, the method further comprises measuring, by the timer arrangement, a second turn on delay associated with the second driver circuitry, measuring, by the timer arrangement, a second turn off delay associated with the first driver circuitry, and determining a second offset for assertion of the second command signal provided to the second driver circuitry for operating the second switching element relative to deassertion of the command signal based on the targeted dead time and a second difference between the second turn on delay and the second turn off delay.

In another embodiment, an apparatus for a semiconductor device is provided. The semiconductor device comprises a semiconductor die, first driver circuitry on the semiconductor die to generate an output voltage signal in response to an input command signal, and a timer arrangement on the semiconductor die and coupled to the driver arrangement to measure a time difference between a first change in the input command signal and a second change in the output voltage signal. In one embodiment, the semiconductor device further comprises control circuitry on the semiconductor die and coupled to the timer arrangement to determine a timing for a subsequent change in the input command signal based at least in part on the time difference.

The foregoing detailed description is merely illustrative in nature and is not intended to limit the embodiments of the subject matter or the application and uses of such embodiments. Any implementation described herein as exemplary is not necessarily to be construed as preferred or advantageous over other implementations. Additionally, there is no intention to be bound by any expressed or implied theory presented in the preceding technical field, background, or the detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. An electronic device comprising:
    a semiconductor die;
    an output interface;
    a driver arrangement on the semiconductor die and coupled to the output interface, the driver arrangement comprising first driver circuitry to generate a switch control signal at the output interface based on an input command signal and second driver circuitry to generate a second switch control signal based on a second command signal;
    a timer arrangement on the semiconductor die and coupled to the driver arrangement to measure a turn on delay associated with a first switching element coupled to the first driver circuitry of the driver arrangement based on a time difference between a first change in the input command signal and a second response to the first change in the switch control signal at the output interface and measure a turn off delay associated with a second switching element coupled to the second driver circuitry based on a second time difference between a third change in the second command signal and a fourth change in the second switch control signal;
    a lookup table including characteristic values for the first switching element;
    a register on the semiconductor die and coupled to the timer arrangement to store one or more of the turn on delay and the turn off delay; and
    control circuitry on the semiconductor die and coupled to the lookup table and the register to:
        determine a switch characteristic value for the first switching element based at least in part on current operating conditions utilizing the lookup table;
        determine a timing for a subsequent change in the input command signal based at least in part on the switch characteristic value, a difference between the turn on delay and the turn off delay, and a target dead time, wherein the subsequent change in the input command signal is adjusted based on the determined timing.

2. The electronic device of claim 1, further comprising a second register to store the target dead time, wherein the control circuitry is coupled to the second register.

3. The electronic device of claim 1, further comprising a pulse generation arrangement coupled between the driver arrangement and the control circuitry to generate the input command signal based on the timing.

4. The electronic device of claim 1, wherein the timer arrangement automatically accrues a timer value in response to the first change in the input command signal and automatically stops accrual of the timer value in response to the second response in the switch control signal.

5. The electronic device of claim 4, wherein the register stores the timer value after the second response in the switch control signal.

6. The electronic device of claim 1, further comprising a pulse generation arrangement fabricated on the semiconductor die, wherein the pulse generation arrangement is coupled between the driver arrangement and the control circuitry to generate the input command signal based on the timing.

7. The electronic device of claim 1, wherein the control circuitry determines an offset for the subsequent change in the input command signal relative to a fifth change in the second command signal based at least in part on the target dead time and the difference between the turn on delay and the turn off delay.

8. The electronic device of claim 1, wherein the output interface comprises a terminal of an electronic device package including the semiconductor die.

9. The electronic device of claim 8, further comprising a control register on the semiconductor die to store the target dead time, wherein the control circuitry is coupled to the control register.

10. The electronic device of claim 1, further comprising a control register on the semiconductor die to store the target dead time, wherein the control circuitry is coupled to the control register.

11. A method of operating switching circuitry comprising a first switching element and a second switching element, the method comprising:
    measuring, by a timer arrangement on a semiconductor die, a turn on delay associated with first driver circuitry on the semiconductor die based on a first time difference between a first change in a first input command signal to the first driver circuitry and a second change in a first output signal at a first output interface coupled to the first driver circuitry, the first output interface being coupled to the first switching element and the first driver circuitry generating the first output signal in response to the first input command signal;
    measuring, by the timer arrangement, a turn off delay associated with second driver circuitry on the semiconductor die based on a second time difference between a third change in a second input command signal to the second driver circuitry and a fourth change in a second output signal at a second output interface coupled to the second driver circuitry, the second output interface being coupled to the second switching element and the second driver circuitry generating the second output signal in response to the second input command signal;

storing, by a first register on the semiconductor die, the turn on delay;

storing, by a second register on the semiconductor die, the turn off delay;

determining, by control circuitry on the semiconductor die, a switch characteristic value for the first switching element based at least in part on current operating conditions utilizing a lookup table; and determining, by control circuitry on the semiconductor die, an offset for a subsequent change in the first input command signal provided to the first driver circuitry for operating the first switching element based on the switch characteristic value, a difference between the turn on delay and the turn off delay, and a targeted dead time, wherein the offset is applied on subsequent first input command signals.

12. The method of claim 11, further comprising wherein determining the offset comprises determining the offset for assertion of the first input command signal relative to deassertion of the second input command signal provided to the second driver circuitry based on the targeted dead time and the difference between the turn on delay and the turn off delay.

13. The method of claim 12, further comprising:

measuring, by the timer arrangement, a second turn on delay associated with the second driver circuitry;

measuring, by the timer arrangement, a second turn off delay associated with the first driver circuitry; and determining a second offset for assertion of the second input command signal provided to the second driver circuitry for operating the second switching element relative to deassertion of the first input command signal based on the targeted dead time and a second difference between the second turn on delay and the second turn off delay.

14. A semiconductor device comprising:

a first output interface;

a second output interface;

first driver circuitry on the semiconductor die to generate a first output voltage signal at the first output interface in response to a first input command signal;

second driver circuitry on the semiconductor die to generate a second output voltage signal at the second output interface in response to a second input command signal;

a timer arrangement on the semiconductor die and coupled to the driver arrangement to measure:

a first time difference between a first change in the first input command signal and a second change in the first output voltage signal at the first output interface, and a second time difference between a third change in the second input command and a fourth change the second output voltage signal at the second output interface;

a first register on the semiconductor die and coupled to the timer arrangement to store the first time difference;

a second register on the semiconductor die and coupled to the timer arrangement to store the second time difference;

a lookup table including characteristic values for a switching element coupled to the first output interface;

control circuitry on the semiconductor die and coupled to the first and second registers and the lookup table to determine a switch characteristic value for the switching element based at least in part on current operating conditions utilizing the lookup table and determine a timing for a subsequent change in the first or second input command signal based at least in part on the first and second time differences in the first and second registers, the switch characteristic value, and a targeted dead time, wherein the subsequent change in the first or second input command signal is adjusted based on the determined timing.

* * * * *